(12) United States Patent
Koch et al.

(10) Patent No.: US 9,916,195 B2
(45) Date of Patent: *Mar. 13, 2018

(54) PERFORMING A REPAIR OPERATION IN ARRAYS

(71) Applicant: International Business Machines Corporation, Armonk, NY (US)

(72) Inventors: Gerrit Koch, Boeblingen (DE); Martin Recktenwald, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 108 days.

This patent is subject to a terminal disclaimer.

(21) Appl. No.: 14/993,361

(22) Filed: Jan. 12, 2016

(65) Prior Publication Data

US 2017/0199781 A1    Jul. 13, 2017

(51) Int. Cl.
*G06F 11/07* (2006.01)
*G06F 12/00* (2006.01)
*G06F 11/10* (2006.01)
*G11C 29/44* (2006.01)
*G11C 29/00* (2006.01)

(52) U.S. Cl.
CPC ........ *G06F 11/0793* (2013.01); *G06F 11/079* (2013.01); *G06F 11/0727* (2013.01); *G06F 11/0751* (2013.01); *G06F 11/1008* (2013.01); *G06F 11/1048* (2013.01); *G06F 11/1076* (2013.01); *G06F 12/00* (2013.01); *G11C 29/4401* (2013.01); *G11C 29/70* (2013.01)

(58) Field of Classification Search
CPC ............. G06F 11/0793; G06F 11/0727; G06F 11/0751; G06F 11/079; G06F 12/00; G06F 11/1076; G06F 11/1008; G06F 11/1048; G11C 29/4401; G11C 29/70
USPC .... 714/764, 763, 773, 25, 54, 710, 718, 723
See application file for complete search history.

(56) References Cited

U.S. PATENT DOCUMENTS 5,477,492 A * 12/1995 Ohsaki ................... G11C 29/74
                                                       365/200
6,236,602 B1 * 5/2001 Patti ....................... G11C 29/42
                                                       365/200

(Continued)

OTHER PUBLICATIONS

List of IBM Patents or Patent Applictions Treated As Related; (Appendix P), Date Filed Jun. 7, 2016 2 pages.

(Continued)

*Primary Examiner* — John J Tabone, Jr.
(74) *Attorney, Agent, or Firm* — Cantor Colburn LLP; Steven Chiu

(57) ABSTRACT

A method for performing a repair operation in a computer system using arrays having array cells includes detecting an error in an array. In response to detecting the error, error information is written to an error trap register. The error information includes error data and associated error detection information and a position in an array row. The error information is read from the error trap register and a corresponding data copy is determined and fetched in the computer system. One or more exact bit positions that caused the error are determined by comparing the error data with the corresponding data copy. The array cells which are associated with the determined one or more bit positions are disabled.

7 Claims, 4 Drawing Sheets

(56) References Cited

U.S. PATENT DOCUMENTS

| | | | |
|---|---|---|---|
| 6,259,639 B1* | 7/2001 | Hashizume | G11C 29/44 365/189.05 |
| 6,480,975 B1 | 11/2002 | Arimilli et al. | |
| 6,851,071 B2 | 2/2005 | Bossen et al. | |
| 7,529,997 B2 | 5/2009 | Meaney et al. | |
| 8,065,555 B2 | 11/2011 | Maiyuran et al. | |
| 9,069,719 B2* | 6/2015 | Ong | G06F 15/167 |
| 9,679,664 B2* | 6/2017 | Ong | G11C 29/12 |
| 2005/0023656 A1* | 2/2005 | Leedy | B81B 7/02 257/678 |
| 2006/0031708 A1 | 2/2006 | Desai | |
| 2008/0155313 A1* | 6/2008 | Schamberger | G11C 29/84 714/6.12 |
| 2009/0119444 A1* | 5/2009 | Davis | G06F 12/0638 711/103 |
| 2013/0212431 A1* | 8/2013 | Ong | G06F 15/167 714/15 |
| 2014/0157065 A1* | 6/2014 | Ong | G11C 29/12 714/718 |
| 2016/0062819 A1* | 3/2016 | Oh | G11C 29/4401 714/6.11 |
| 2016/0155722 A1* | 6/2016 | Leedy | H01L 25/0657 257/686 |
| 2016/0196179 A1* | 7/2016 | Zhao | H03M 13/356 714/764 |
| 2016/0284422 A9* | 9/2016 | Ong | G11C 29/12 |

OTHER PUBLICATIONS

U.S. Appl. No. 15/175,285, filed Jun. 7, 2016; Entitled: Performing a Repair Operation in Arrays.

G. Theodorou et al., "A Software-Based Self Test methodology for on-line testing of processor caches", IEEE, Sep. 2011, 3 pages, (Abstract Only).

S. S. Mukherjee et al., "Cache Scrubbing in Microprocessors: myth or necessity?", IEEE, Mar. 2004, 3 pages. (Abstract Only).

* cited by examiner

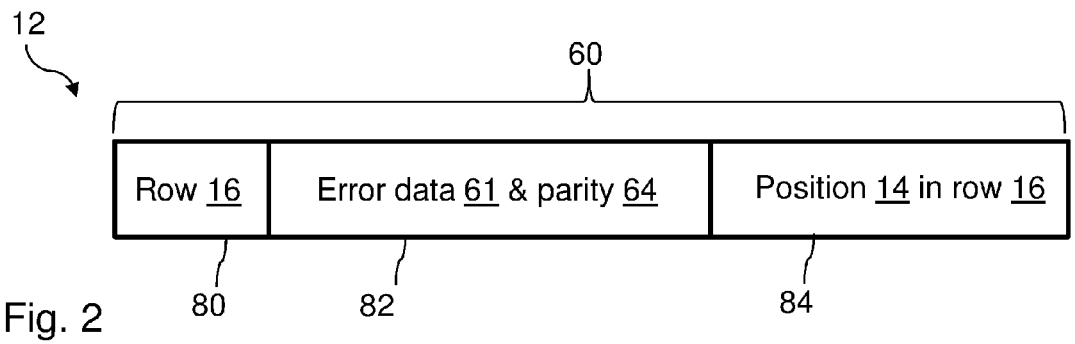
Fig. 2
|  | Data | Parity |
|---|---|---|
| Error data 61 & Parity 64 | 01001011 | 1 |
| Data copy 62 & Parity 65 | 01001010 | 1 |
| XOR | 00000001 | 0 |
Fig. 3
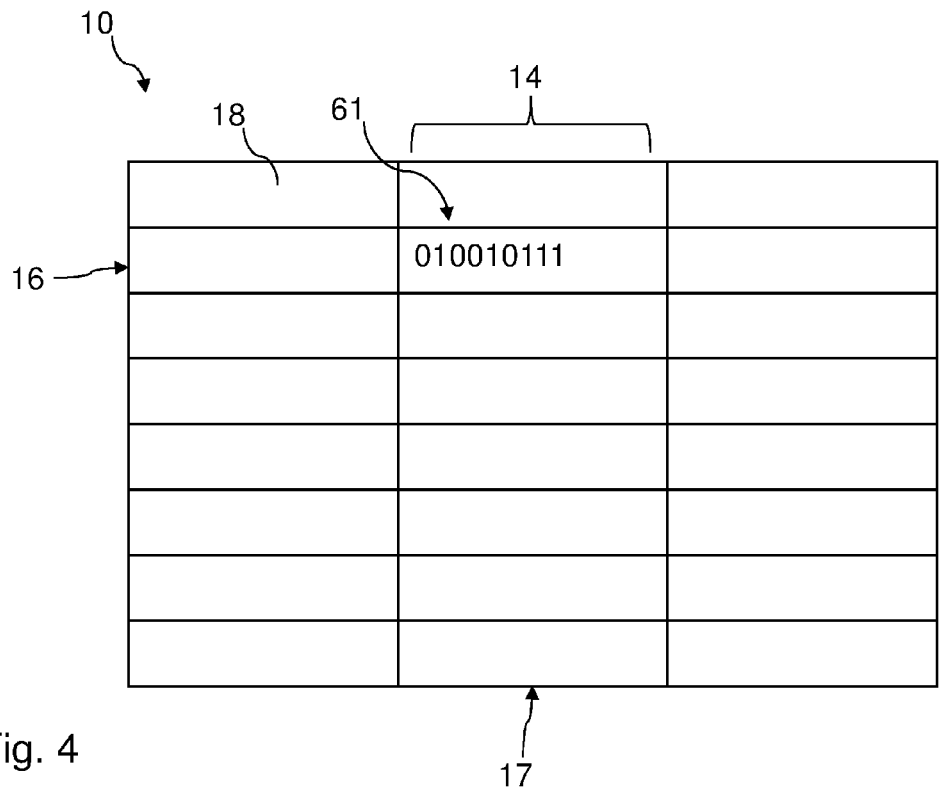
Fig. 4

PERFORMING A REPAIR OPERATION IN ARRAYS

BACKGROUND

The present invention relates generally to data processing systems, and more specially, to a method, system and computer program product for performing a repair operation in a computer system using arrays having array cells.

Storage arrays on a microprocessor chip, such as static random access memories (SRAMs) or embedded dynamic random access memories (EDRAMs), are usually tested with special array test procedures (ABIST—"array built-in self-test") before running functional tests. To improve yield, such array structures often include redundancy to allow repairing certain types of manufacturing defects. One of the main purposes of ABIST is to determine this repair information.

However, even the best testing cannot cover all usage scenarios. Some types of defects tend to escape systematic testing. To avoid system failures, systems have to be built to deal with such array defects (e.g. by implementing parity to detect a problem and prevent error propagation). Ideally, array defects that escaped testing but are detected during functional use should also get added to the array repair information, the same way as array defects found during ABIST testing.

If the error detection scheme includes a method that identifies the exact location of the failing bit (e.g., certain types of error correcting code (ECC)), a "perfect" repair is possible. This does not work for a simple parity scheme, where essentially all the information that is available is which parity group was failing, and the location of that parity group within the array; but not the exact bit that failed. Even if redundancy were available, it would be prohibitively expensive to replace a whole parity group with redundant array cells.

SUMMARY

Embodiments include a method, system, and computer program product for performing a repair operation in a computer system using arrays having array cells. A method includes detecting an error in an array. In response to detecting the error, error information is written to an error trap register. The error information includes error data and associated error detection information and a position in an array row. The error information is read from the error trap register and a corresponding data copy is determined and fetched in the computer system. One or more exact bit positions that caused the error are determined by comparing the error data with the corresponding data copy. The array cells which are associated with the determined one or more bit positions are disabled.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2 depicts an error trap register method in accordance with one or more embodiments;

FIG. 3 depicts an example of determining an exact bit position having caused the error in an array in accordance with one or more embodiments;

FIG. 4 depicts an example array exhibiting an error method in accordance with one or more embodiments;

DETAILED DESCRIPTION

Figure 1:
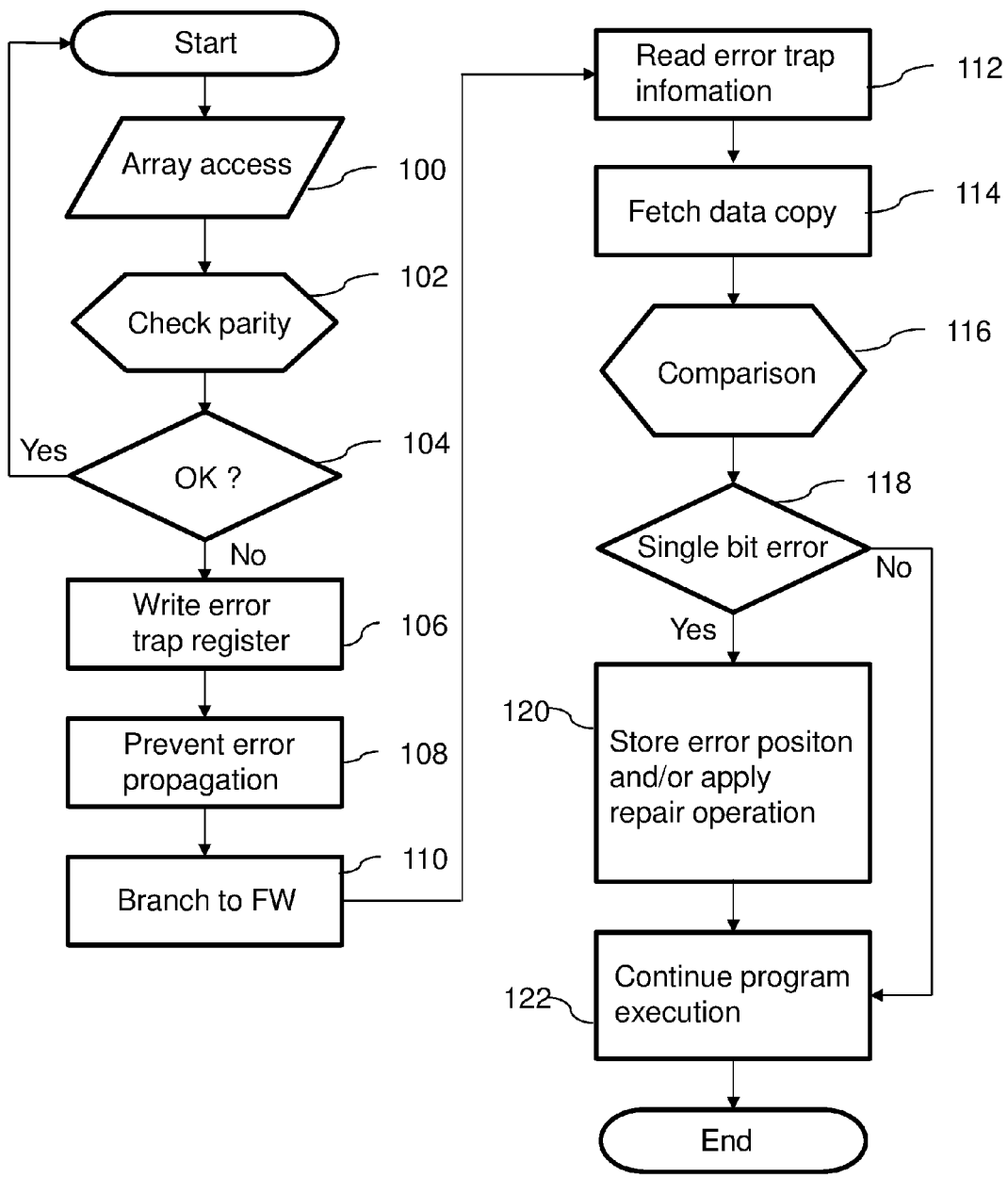
FIG. 1 depicts a flow chart of a method in accordance with one or more embodiments.

In the drawings, like elements are referred to with the same reference numerals. The drawings are merely schematic representations, and not intended to portray specific parameters of embodiments of the invention. Moreover, the drawings are intended to depict only typical embodiments of the invention and therefore should not be considered as limiting the scope of the invention.

Reference numerals used in the description refer to FIGS. 1 to 6.

The illustrative embodiments described herein provide a method, system, and computer program product for performing a repair operation in a computer system using arrays having array cells. The illustrative embodiments are sometimes described herein using particular technologies only as an example for the clarity of the description. The illustrative embodiments may be used for performing the following: detecting an error or failing data 61 in an array 10; in response to detecting the error, writing error information 60 to an error trap register 12, wherein the error information 60 include at least the error data 61 and associated error detection information and a position 14 in an array row 16; reading the error information 60 from the error trap register 12; determining and fetching a corresponding data copy 62 in the computer system 212 for the read error information 60; determining one or more exact bit positions 15 that caused the error 61 by comparing the error data 61 with the corresponding data copy 62; and disabling those of the array cells 18 which are associated with the determined one or more bit positions 15. As used herein, "disabling the array cells 18" refers to reconfiguring the array to use redundant bits instead of the failing bits. As compared to contemporary approaches, embodiments do not require that the full parity group has to be replaced with redundant array bits, but only the failing bits.

Embodiments can also be applied to a computer system 212, where the computer system 212 includes a processor cache hierarchy, where a hierarchy level is implemented using cache arrays 20, the cache arrays 20 having cache cells 18. The system can perform a method that includes: detecting an error 61 in the cache array 20; in response to detecting the error, writing error information 60 to the error trap register 12, where the error information 60 include at least the error data 61 and associated error detection information and the position 14 in a cache array row 26; reading the error information 60 from the error trap register 12; determining and fetching a corresponding data copy 62 in another processor cache hierarchy level for the read error information; determining one or more exact bit positions 15 that caused the error 61 by comparing the error data 61 with the corresponding data copy 62; and disabling those of the cache array cells 28 which are associated with the determined one or more bit positions 15.

Turning now to FIG. 1, a flow chart of a method is generally shown in accordance with one or more embodiments. When an error data 61 is detected while reading data from arrays 10, information about the fail is stored in an error trap register 12. This information includes the actual failing error data 61 as well as additional information such as, for example, parity data 64. Normal program flow in the computer system 212 is interrupted and control is handed over to firmware. Firmware then reads the information in the error trap register 12, and reads a known good copy of the data 62 from a different place in the computer system 212. Comparing the error trap data against the known good data copy 62 including the corresponding parity data 64, 65 allows the calculation of the exact position 15 of the failing bit. This information can then be used to repair the arrays 10 using existing array repair approaches. Normal program flow continues after handling the error situation.

As compared to contemporary solutions, in embodiments the repair operation can be performed on a "live" computer system 212, i.e. it can be done during normal system operation, and no complex array data protection codes such as ECC are required.

As shown in the embodiment in FIG. 1, following a cache array access at block 100, the data read out from the arrays 10 is checked for correctness at block 102. If the data is determined to be correct at block 104, no further action will be taken. If the data is found to be wrong, such as by finding an error when doing a parity check, an array error trap register 12 is written in block 106 (e.g., the error trap register 12 shown in FIG. 5). FIG. 2 shows an example embodiment of the contents of such an error trap register 12.

The error trap register 12 may hold as error information 60: an indication of the position in the array 10 where the error presumably occurred, including the array row 16 and information about the position 14 within the row 16 as well as the actual error data 61 read out of the array 10, and all checking bits associated with it, e.g. parity bits 64.

In an embodiment, the indication for the position of the fail in the array row 16 depends on the physical layout of the array 10 and the logical placement of the data in the array 10. For a typical cache array 20 in a set-associative cache, the information can include the byte offset within the cache array 20, and the number of the set of the cache array 20 that was accessed.

In addition to writing the error trap register 12, error propagation can be prevented at block 108 to avoid continuing program execution with the known wrong data. This can be done by sending signal 72 to the processor core 30, as indicated in FIG. 5.

To fully determine the exact bit position 15 of the fail, the error data 61 can be compared against a known good data copy 62. To do this, as shown in FIG. 1, block 110 branches to firmware, e.g. by setting an interrupt as a result of detecting signal 72 active. In alternate embodiments, instead of branching to firmware, the following blocks can also be implemented by a hardware state machine. Due to the complexity involved, it may be beneficial to have firmware implement the steps manually.

Figure 5:
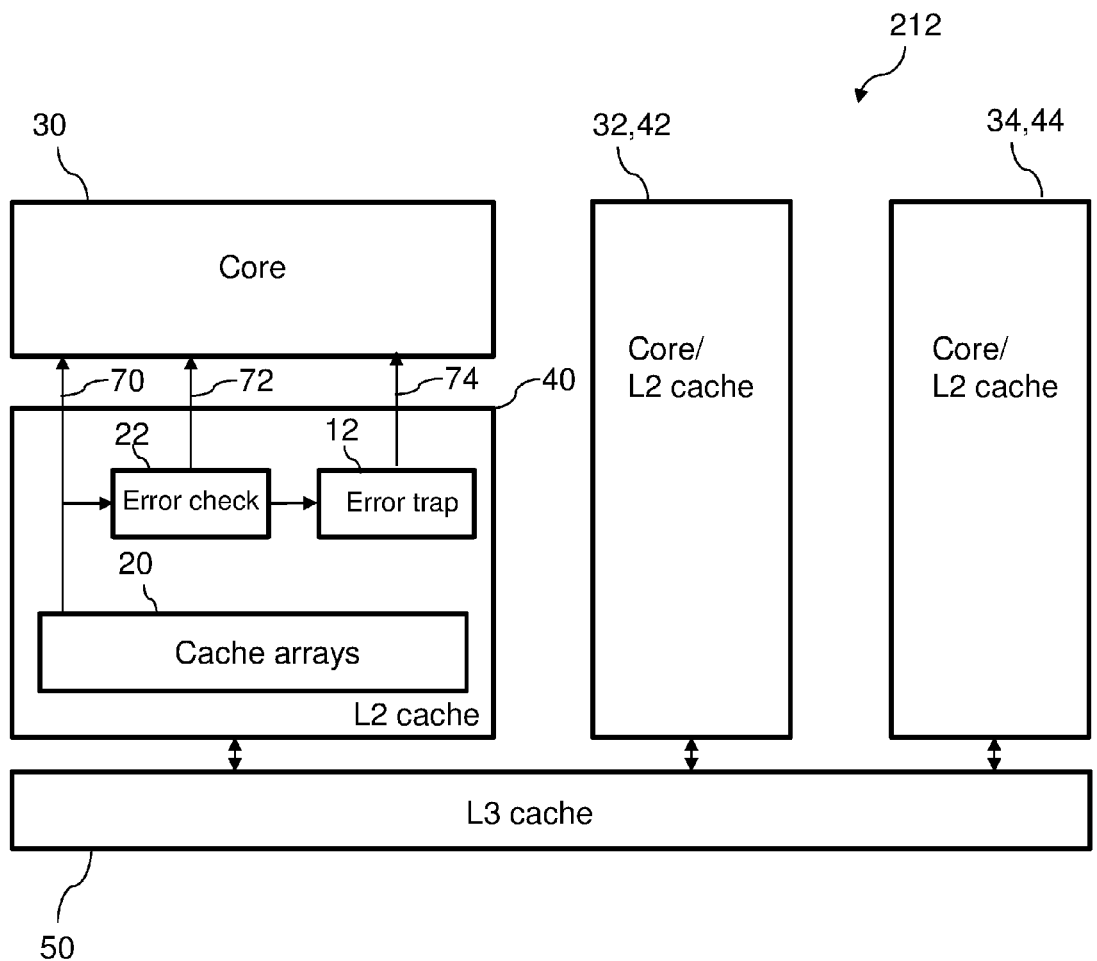
FIG. 5 depicts a computer system for performing a repair operation on arrays in accordance with one or more embodiments.

At block 112, the data in the array error trap register 12 is read out, e.g. using interface 74 shown in FIG. 5. Next, the known good data copy 62 is read at block 114. In the environment of the computer system 212 described in FIG. 5, this can be done by a normal fetch access, as the L3 cache 50 always holds a known good data copy 62. Care has to be taken that block 114 does not try to access the error data 61 again. This can be achieved by going through a full recovery process that involves throwing away all data in the local caches (clearing all of the L2 cache 40 in FIG. 5), or by just invalidating the one known bad entailing row position 14 (e.g., by having firmware store this information to a database of known hardware failures). It can then be applied on the next reboot by the same means as normal array repair information that was already determined at chip test time. A translation table can be used to have firmware translate the information found in the trap register into actual array repair information, thus disabling those of the array cells 18 which are associated with the determined one or more bit positions 15. If the system supports array repair on a running system, the array defect can also be repaired immediately, without having to wait for the next system restart.

At block 122, the process branches back to the program that was interrupted while trying to access the error data 61, and the instruction that was interrupted is re-tried.

It is possible that block 118 shows more than a single fail between the error data 61 in the error trap register 12 and the known good data copy 62. This can happen if other updates to the known good data copy 62 are possible. This can happen for example, in the computer system 212 shown in FIG. 5 where the L3 cache 50 is connected to multiple processor cores 32, 34, and a different core can change the contents while the local core 30 is busy handling the array fail. Because there is no useful indication in this case as to where in the array 10 the real error occurred, block 120 is skipped, and the error remains unrepaired. It would probably show up again at a later time and can most likely be identified then.

It should be noted that embodiments can also be applied to more than single bit differences in block 118. This is beneficial when multi-bit fails are considerably more likely than an update to the known good data copy 62 by another processor core 32, 34.

Thus, embodiments may indicate an error based on detecting single bit differences by determining one or more exact bit positions 15 that caused the error by comparing the error data 61 with the corresponding data copy 62, as well as based on multiple bit differences. The repair operation may be performed if an error indication lies below a predetermined threshold of bit differences, and if not normal operation is continued.

Parity protection is given as an example; any other error detection scheme that does not allow calculation of the failing bit position 15 by using only the failing data and checking bits may benefit from embodiments in the same way.

According to an embodiment, a repair operation may be provided for arrays 10 protected by a scheme that does not include a means to directly determine a fail in one of the one or more bit position 15.

Turning now to FIG. 2 an error trap register 12 is generally shown in accordance with an embodiment. The hardware error trap register 12 contains error information 60, which can include error data 61 as well as parity data 64 in field 82, in field 80 the failing row number 16, and in field 84 the position 14 of the error data 61 in the corresponding row 16. Parity data 64 may be provided as associated error detection information, as shown below. Thus, the error trap register 12 may comprise and/or provide information about an access of the array 10, 20 as well as a positon 14 of an access of the array 10, 20, wherein the method itself comprises means to access the error trap register 12.

FIG. 3 depicts an example of determining an exact bit position 15 having caused the error 61 in an array 10 according to an embodiment of the invention. The error information 60 comprises not only the error data 61, but also parity data 64. The data shown in FIG. 3 exhibit an even number of ones for the error data 61 and parity data 64 of 1. As by definition the parity data 64 should be 0 in this case, there must be an error in the array 10. The data copy 62 exhibits an uneven number of ones and a parity data 65 of 1, which is correct. Therefore the error data 61 are compared to the data copy 62 by an XOR in order to get the exact bit position 15 of the failing bit within the array cell 18.

FIG. 4 shows an example array 10 with an error. The array 10 comprises 8 rows, which are 27 bits wide. The width is divided into 3 columns with 9 bits in each column. Only the failing data 61 is shown. The failing row 16 is identified by the field 80 of the error trap register 12 in FIG. 2, whereas the failing position 14 within the row is identified by field 84 in the error trap register 12. The failing column 17 in the array 10 may be identified by the XOR operation described in FIG. 3.

In embodiments where a large number of array structures are used, such as by the caches in a microprocessor, it is often beneficial to use parity instead of ECC due to the lower area usage and circuit delays. This can be especially important for caches that are close to or are part of a microprocessor core because in such applications, a simple parity scheme with a robust processor recovery mechanism may be the preferred choice over implementing ECC.

FIG. 5 depicts a computer system for performing a repair operation on arrays in accordance with one or more embodiments. FIG. 5 can be used by a method that uses cache arrays 20, which may be particularly useful for error correction, as cache arrays 20 are usually very large arrays. FIG. 5 shows an embodiment of a general hardware environment that embodiments of methods described herein can be applied to. In an embodiment, a processor core 30 receives data from an L2 cache 40 and sends store data to the L2 cache 40 (store data not shown in the FIG. 5). The L2 cache 40 itself connects to an L3 cache 50 which is shared between multiple cores 32, 34/L2 caches 42, 44, respectively. There can be more cache levels and eventually memory behind the L3 cache 50.

The L2 cache arrays 20 are protected by parity. Error checking 22 does the parity check on data read from the cache arrays 20 that is in parallel sent through interface 70 into the core 30. If an error is detected, the error checking hardware 22 sends an indication through interface 72 to the processor core 30, and all the information it knows about the error to the error trap register 12. An interface 74 is provided between the error trap register 12 and the processor core 30 to allow firmware code to read out the information stored in the error trap register 12.

In an embodiment, the L2 cache 40 is a store-through cache. This means that all updates done in the L2 cache 40 by stores from the processor core will also be forwarded to the L3 cache 50. Therefore, the L3 cache 50 always holds a copy of all the data in the L2 cache 40, which may serve as a "known good" data copy 62.

Embodiments of the method of performing a repair operation as described herein may also be applied if the processing core 30 is part of a network system.

Figure 6:
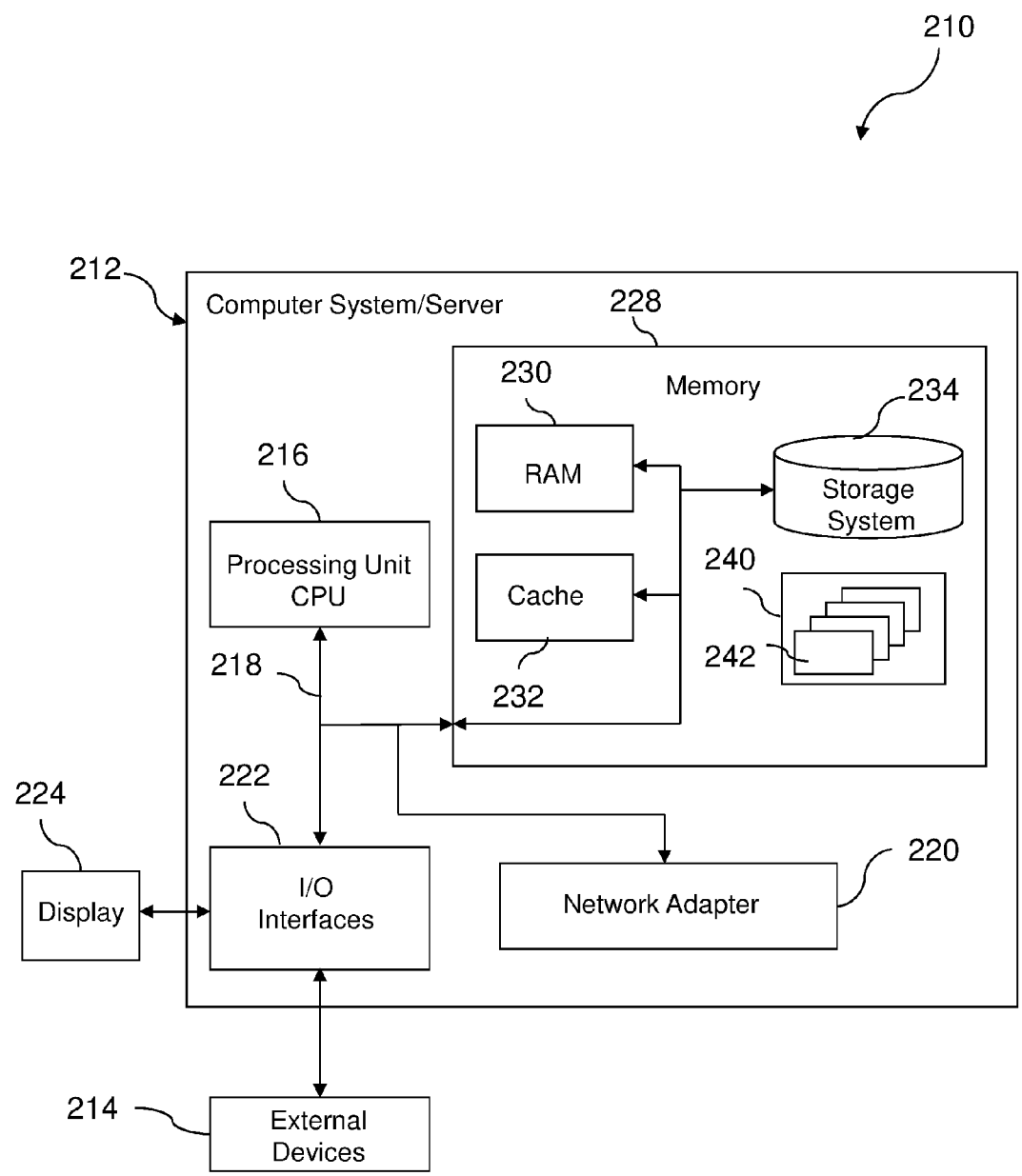
FIG. 6 depicts a data processing system for performing a repair operation on arrays in accordance with one or more embodiments.

Referring now to FIG. 6, a schematic of an embodiment of a data processing system 210 is shown. Data processing system 210 is only one example of a suitable data processing system and is not intended to suggest any limitation as to the scope of use or functionality of embodiments of the invention described herein. Regardless, data processing system 210 is capable of being implemented and/or performing any of the functionality set forth herein above.

In data processing system 210 there is a computer system/server 212, which is operational with numerous other general purpose or special purpose computing system environments or configurations. Examples of well-known computing systems, environments, and/or configurations that may be suitable for use with computer system/server 212 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 212 may be described in the general context of computer system executable instructions, such as program modules, being executed by a computer system. Generally, program modules may include routines, programs, objects, components, logic, data structures, and so on that perform particular tasks or implement particular abstract data types. Computer system/server 212 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 6, computer system/server 212 in data processing system 210 is shown in the form of a general-purpose computing device. The components of computer system/server 212 may include, but are not limited to, one or more processors or processing units 216, a system memory 228, and a bus 218 that couples various system components including system memory 228 to processor 216.

Bus 218 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 212 typically includes a variety of computer system readable media. Such media may be any available media that is accessible by computer system/server 212, and it includes both volatile and non-volatile media, removable and non-removable media.

System memory 228 can include computer system readable media in the form of volatile memory, such as random access memory (RAM) 230 and/or cache memory 232. Computer system/server 212 may further include other removable/non-removable, volatile/non-volatile computer system storage media. By way of example only, storage system 234 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD- ROM, DVD-ROM or other optical media can be provided. In such instances, each can be connected to bus 218 by one or more data media interfaces. As will be further depicted and described below, memory 228 may include at least one program product having a set (e.g., at least one) of program modules that are configured to carry out the functions of embodiments of the invention.

Program/utility 240, having a set (at least one) of program modules 242, may be stored in memory 228 by way of example, and not limitation, as well as an Operating System, one or more application programs, other program modules, and program data. Each of the Operating System, one or more application programs, other program modules, and program data or some combination thereof, may include an implementation of a networking environment. Program modules 242 generally carry out the functions and/or methodologies of embodiments of the invention as described herein.

Computer system/server 212 may also communicate with one or more external devices 214 such as a keyboard, a pointing device, a display 224, etc.; one or more devices that enable a user to interact with computer system/server 212; and/or any devices (e.g., network card, modem, etc.) that enable computer system/server 212 to communicate with one or more other computing devices. Such communication can occur via Input/Output (I/O) interfaces 222. Still yet, computer system/server 212 can communicate with one or more networks such as a local area network (LAN), a general wide area network (WAN), and/or a public network (e.g., the Internet) via network adapter 220. As depicted, network adapter 220 communicates with the other components of computer system/server 212 via bus 218. It should be understood that although not shown, other hardware and/or software components could be used in conjunction with computer system/server 212. Examples, include, but are not limited to: microcode, device drivers, redundant processing units, external disk drive arrays, RAID systems, tape drives, and data archival storage systems, etc.

As described herein, embodiments include a method for performing a repair operation in a computer system using arrays having array cells. The method can include: detecting an error in an array; in response to detecting the error, writing error information to an error trap register, wherein the error information comprise at least error data and associated error detection information and a position in an array row; reading the error information from the error trap register; determining and fetching a corresponding data copy in the computer system for the read error information; determining one or more exact bit positions that caused the error by comparing the error data with the corresponding data copy; and disabling those of the array cells which are associated with the determined one or more bit positions.

According to embodiments of the method, the array defect can be located in an array on a running system, i.e. it can be done during normal system operation, even though only parity is stored in the arrays together with the data. No complex array data protection codes, such as ECC, are required. The method allows repair of array defects that can only be found when running real workloads. A major benefit of the method is that not the full parity group has to be replaced with redundant array bits, but only the failing bits. In particular, this allows repairing array fails for systems running in a customer environment, eliminating the need for additional spare parts or replacement of defective parts at a customer site.

Embodiments can be implemented as a computer system that includes a processor cache hierarchy, wherein a hierarchy level is implemented using cache arrays, the cache arrays having cache cells. Embodiments can also be implemented as a computer program product for performing a repair operation in a computer system using arrays having array cells, the computer program product including a computer readable storage medium having program instructions embodied therewith, the program instructions executable by a computer to cause the computer for each patch set to perform the method described herein.

Further, a data processing system for execution of a data processing program is proposed, comprising computer readable program instructions for performing the method described above.

The present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device.

The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, Firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A computer program product for performing a repair operation in a computer system using arrays having array cells, the computer program product comprising:
 a tangible non-transitory storage medium readable by a processing circuit and storing instructions for execution by the processing circuit to perform a method comprising:
 detecting an error in an array;
 in response to detecting the error, writing error information to an error trap register, wherein the error information comprise error data and associated error detection information and a position in an array row;
 reading the error information from the error trap register;
 determining and fetching a corresponding data copy in the computer system for the read error information, wherein the corresponding data copy is a known good data copy of a data that includes the error and wherein the corresponding data copy is obtained from a different level cache than a location that includes the error;
 determining one or more bit positions that caused the error by comparing the error data with the corresponding data copy; and
 disabling those of the array cells that correspond to the determined one or more bit positions, wherein the disabling comprises reconfiguring the array to use redundant bits instead of the one or more bit positions and wherein the reconfiguring only prevents the use of the one or more bit positions.

2. The computer program product of claim 1, wherein the computer system comprises a processor cache hierarchy, wherein a hierarchy level is implemented using cache arrays, the cache arrays having cache cells, the method further comprising:
 detecting an error in the cache array;
 in response to detecting the error, writing error information to the error trap register, wherein the error information comprises at least the error data and associated error detection information and a position in a cache array row;
 reading the error information from the error trap register;
 determining and fetching a corresponding data copy in another processor cache hierarchy level for the read error information;
 determining one or more exact bit positions that caused the error by comparing the error data with the corresponding data copy; and
 disabling those of the cache array cells which are associated with the determined one or more bit positions.

3. The computer program product of claim 1, wherein the method further comprises indicating an error based on detecting single bit differences by determining one or more exact bit positions that caused the error by comparing the error data with the corresponding data copy.

4. The computer program product of claim 1, wherein the method further comprises indicating an error based on detecting multiple bit differences by determining one or more exact bit positions that caused the error by comparing the error data with the corresponding data copy.

5. The computer program product of claim 1, wherein the method further comprises providing parity data as associated error detection information.

6. A system for performing a repair operation in a computer system using arrays having array cells, the system comprising:
   a memory having computer readable computer instructions; and
   a processor for executing the computer readable instructions, the computer readable instructions including:
   detecting an error in an array;
   in response to detecting the error, writing error information to an error trap register, wherein the error information comprise error data and associated error detection information and a position in an array row;
   reading the error information from the error trap register;
   determining and fetching a corresponding data copy in the computer system for the read error information, wherein the corresponding data copy is a known good data copy of a data that includes the error and wherein the corresponding data copy is obtained from a different level cache than a location that includes the error;
   determining one or more bit positions that caused the error by comparing the error data with the corresponding data copy; and
   disabling those of the array cells that correspond to the determined one or more bit positions, wherein the disabling comprises reconfiguring the array to use redundant bits instead of the one or more bit positions and wherein the reconfiguring only prevents the use of the one or more bit positions.

7. The system according to claim 6, wherein the computer system comprises a processor cache hierarchy, wherein a hierarchy level is implemented using cache arrays, the cache arrays having cache cells, and the computer readable instructions further include:
   detecting an error in the cache array;
   in response to detecting the error, writing error information to the error trap register, wherein the error information comprises at least the error data and associated error detection information and a position in a cache array row;
   reading the error information from the error trap register;
   determining and fetching a corresponding data copy in another processor cache hierarchy level for the read error information;
   determining one or more exact bit positions that caused the error by comparing the error data with the corresponding data copy; and
   disabling those of the cache array cells which are associated with the determined one or more bit positions.

* * * * *